United States Patent
Reykowski et al.

(10) Patent No.: US 11,209,508 B2
(45) Date of Patent: Dec. 28, 2021

(54) INVERSE DISPERSIVE FILTER FOR DYNAMIC RANGE COMPRESSION IN MR

(71) Applicant: KONINKLIJKE PHILIPS N.V., Eindhoven (NL)

(72) Inventors: Arne Reykowski, Newberry, FL (US); George Randall Duensing, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/973,821

(22) PCT Filed: Jun. 11, 2019

(86) PCT No.: PCT/EP2019/065092
§ 371 (c)(1),
(2) Date: Dec. 10, 2020

(87) PCT Pub. No.: WO2019/238617
PCT Pub. Date: Dec. 19, 2019

(65) Prior Publication Data
US 2021/0181277 A1    Jun. 17, 2021

Related U.S. Application Data

(60) Provisional application No. 62/683,848, filed on Jun. 12, 2018.

(51) Int. Cl.
*G01R 33/36* (2006.01)

(52) U.S. Cl.
CPC ..... *G01R 33/3621* (2013.01); *G01R 33/3607* (2013.01); *G01R 33/3614* (2013.01)

(58) Field of Classification Search
CPC ............ G01R 33/3621; G01R 33/3607; G01R 33/3614
See application file for complete search history.

(56) References Cited

U.S. PATENT DOCUMENTS

| | | |
|---|---|---|
| 5,451,876 A | 9/1995 | Sandford et al. |
| 2003/0062895 A1 | 4/2003 | Vester |
| 2003/0083568 A1 | 5/2003 | Frigo et al. |

(Continued)

OTHER PUBLICATIONS

Search Report and Written Opinion Form PCT/EP2019/065092 dated Sep. 25, 2019.

*Primary Examiner* — G. M. A Hyder

(57) ABSTRACT

A radio frequency (RF) device for receiving or exciting a magnetic resonance (MR) signal includes an MR coil (22, 32) tuned to an MR frequency band, a digital signal processing chain (40, 44, 58, 70) at least partly tuned to operate at baseband, an analog signal processing chain (48, 50, 54, 60) operatively connected with the MR coil and at least partly tuned to operate at the MR frequency band, and an analog to digital (A/D) or digital-to-analog (D/A) converter (46, 56) connecting the digital signal processing chain and the analog signal processing chain. The analog signal processing chain includes an analog dispersive delay line (50, 60) tuned to impose a frequency-dependent signal delay (52, 62) that is monotonically increasing or monotonically decreasing over the MR frequency band. In more specific embodiments, the RF device may comprise an MR transmit chain (20), or an MR receive chain (30).

20 Claims, 2 Drawing Sheets

(56) References Cited

U.S. PATENT DOCUMENTS

| | | | |
|---|---|---|---|
| 2007/0259630 A1* | 11/2007 | Huber | H03F 1/3282 |
| | | | 455/127.1 |
| 2008/0204027 A1 | 8/2008 | Luedeke et al. | |
| 2012/0319884 A1 | 12/2012 | Bollenbeck et al. | |
| 2013/0119982 A1 | 5/2013 | Pirkl | |
| 2014/0062480 A1 | 3/2014 | Bollenbeck et al. | |

* cited by examiner

INVERSE DISPERSIVE FILTER FOR DYNAMIC RANGE COMPRESSION IN MR

CROSS REFERENCE TO RELATED APPLICATIONS

This application is a U.S. national phase application of International Application No. PCT/EP2019/065092 filed Jun. 11, 2019, which claims the benefit of U.S. Provisional Application Ser. No. 62/683,848 filed Jun. 12, 2018 and is incorporated herein by reference.

FIELD

The following relates generally to the magnetic resonance (MR) imaging arts, MR spectroscopy arts, MR angiography arts, and related arts.

BACKGROUND

Magnetic resonance (MR) devices employ transmit and receive radio frequency (RF) electronics that operate at high dynamic range. For example, MR excitation typically employs a sharply peaked RF pulse over a narrow frequency band generally centered at the MR frequency and thus has high amplitude at the pulse peak but much lower amplitude elsewhere. A typical received MR signal is an echo in which all of the spins add coherently at a moment in time near the center of k-space leading to a high signal, and are incoherent in some other areas of k-space leading to much lower signal. To handle such a large dynamic range, MR imaging or spectroscopy devices typically employ specialized RF modulators in the transmit RF chain, and specialized receivers, typically with relatively high speed ADC's and large numbers of bits in order to maintain acceptable SNR without clipping the signals.

These costly and specialized hardware requirements are made more onerous by the widespread use in MR imaging of local MR receiver coils or coil arrays. These have architectural advantages and can improve sensitivity, for example by locating a local coil or coil array on or closely proximate to the surface of the anatomy to be imaged, or using a head coil that encloses the head undergoing imaging, or so forth. But, the requirements for high dynamic range and low noise in these receive chains result in relatively high power and cost of these devices.

The following discloses new and improved systems and methods.

SUMMARY

In one disclosed aspect, a radio frequency (RF) device for receiving or exciting a magnetic resonance (MR) signal in an MR imaging or spectroscopy subject is disclosed. The RF device comprises: an MR coil tuned to an MR frequency band; a digital signal processing chain at least partly tuned to operate at baseband; an analog signal processing chain operatively connected with the MR coil and at least partly tuned to operate at the MR frequency band; and an analog to digital (A/D) or digital-to-analog (D/A) converter connecting the digital signal processing chain and the analog signal processing chain. The analog signal processing chain includes an analog dispersive delay line tuned to impose a frequency-dependent signal delay that is monotonically increasing or monotonically decreasing over the MR frequency band.

In another disclosed aspect, an RF device comprises an MR receive coil configured to receive an MR signal in an MR frequency band, an analog dispersive delay line connected to disperse the MR signal received by the MR receive coil to generate a dispersed MR signal, and an A/D converter connected to generate a digitized dispersed MR signal from the dispersed MR signal.

In another disclosed aspect, an RF device comprises a digital signal processing chain configured to generate a digital signal in an MR frequency band, a D/A converter configured to convert the digital signal to an analog signal, and an analog dispersive delay line connected to increase dynamic range of the analog signal to generate an RF excitation pulse. The RF device may further comprise an MR transmit coil tuned to transmit an MR excitation signal in response to receiving the RF excitation pulse generated by the analog dispersive delay line.

One advantage resides in providing a radio frequency (RF) transmit chain for a magnetic resonance (MR) imaging and/or spectroscopy device with reduced dynamic range requirements.

Another advantage resides in providing for retrofitting an existing RF transmit chain of such an MR device to provide the foregoing advantage with limited hardware modification.

Another advantage resides in providing an RF receive chain for an MR imaging and/or spectroscopy device with reduced dynamic range requirements.

Another advantage resides in providing for retrofitting an existing RF receive chain of such an MR device to provide the foregoing advantage with limited hardware modification.

Another advantage resides in providing for one or more of the foregoing advantages implemented by way of a lossless signal decompression and/or compression methodology.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention. In drawings presenting log or service call data, certain identifying information has been redacted by use of superimposed redaction boxes.

DETAILED DESCRIPTION

Figure 1:
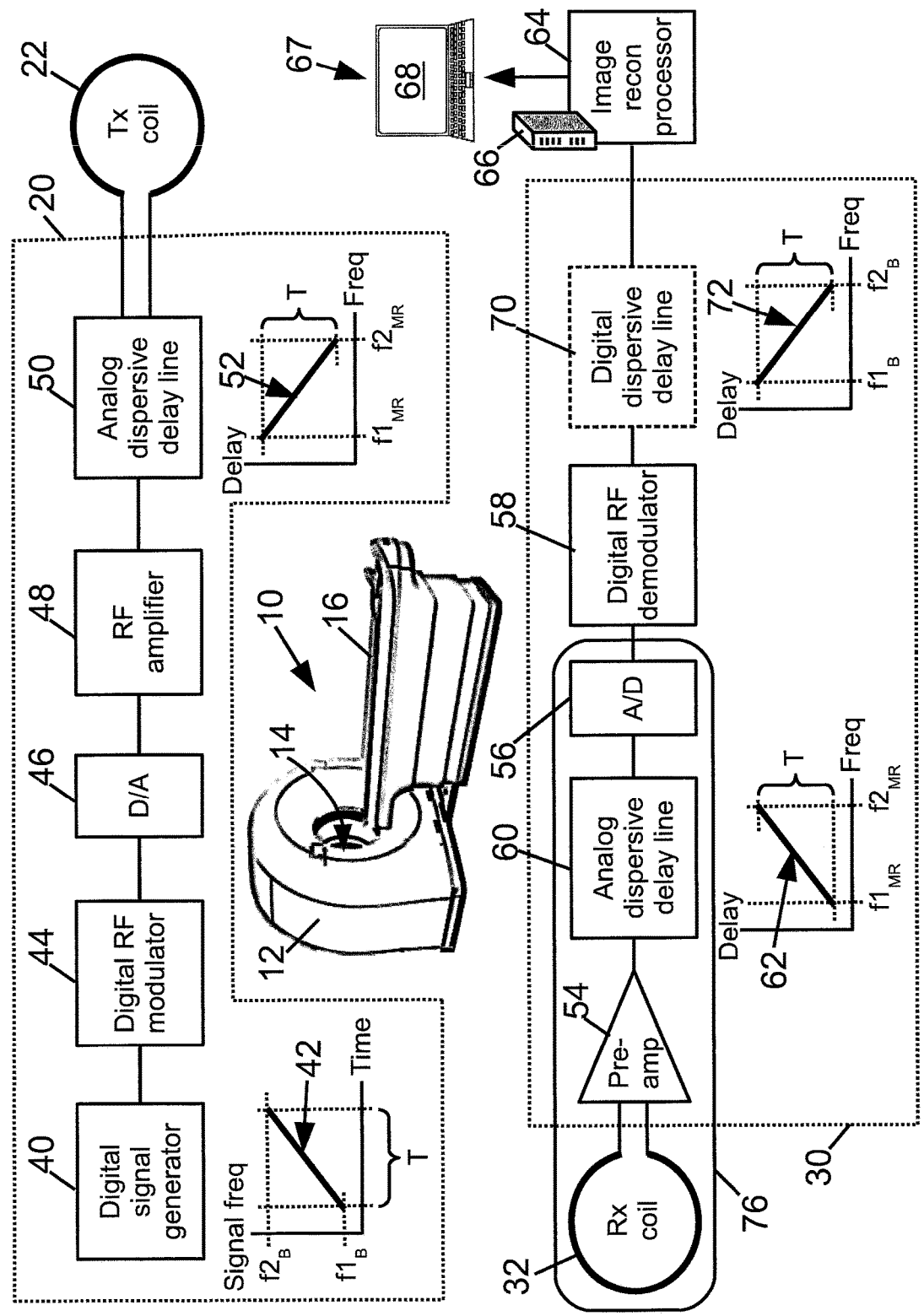
FIG. 1 diagrammatically illustrates a magnetic resonance (MR) imaging and/or spectroscopy device, with the radio frequency (RF) transmit and RF receive chains diagrammatically shown.

With reference to FIG. 1, a magnetic resonance (MR) imaging and/or spectroscopy device 10 includes a gantry or housing 12 that contains internal components (not shown) typically including a static magnet (resistive or superconducting with appropriate cryogenic containment) producing a static magnetic field (typically denoted $B_0$) and sets of magnetic field gradient windings for superimposing magnetic field gradients on the $B_0$ field along various spatial directions (e.g. transverse x- and y-gradient windings and longitudinal z-gradient windings). The MR device 10 typically includes other accessory and/or auxiliary hardware, e.g. magnetic field gradient pulse generators, monitoring sensors, et cetera also not shown. A medical patient or other imaging subject is loaded into an examination region (illustrative bore) 14 via a patient couch or other subject support 16 for MR imaging or for MR spectroscopy or MR spectroscopic imaging.

As further depicted diagrammatically in FIG. 1, the MR device 10 further includes radio frequency (RF) devices for exciting and receiving MR signals, such as an illustrative MR transmit chain 20 driving an MR transmit coil 22, and an MR receive chain 30 processing MR signals received by an MR receive coil 32. The MR excitation and received MR signals are in an MR frequency band, which is generally centered at the MR frequency given by $$f_{MR} = \left(\frac{1}{2\pi}\right)\gamma B_0$$

where $B_0$ is the static magnetic field (e.g. as non-limiting examples some commercial MR imaging devices employ $|B_0|$ of 1.5 Tesla or 3.0 Tesla depending on the employed static magnet) and $\gamma$ is the gyrometric ratio which depends on the excited nuclear spins, e.g. for MR imaging using $^1H$ spins $$\left(\frac{1}{2\pi}\right)\gamma \cong 42.577 \text{ MHz/Tesla}$$

so at a magnetic field of 3 Tesla $f_{MR} \cong 128$ MHz. The MR frequency band will have some bandwidth approximately centered at $f_{MR}$, typically on the order of 5-100 kHz although larger (e.g. 1 MHz) or smaller MR bandwidth may be employed, and is in general dependent on the value of $|B_0|$ and design parameters of the MR imaging device, as well as on the parameters of the MR imaging and/or spectroscopy pulse sequence employed in a particular imaging and/or spectroscopy session, e.g. may be larger for multi-nuclei imaging in which MR signals from spins other than $^1H$ are acquired.

The MR transmit coil 22 and the MR receive coil 32 are each illustrated in FIG. 1 as a single loop coil. More generally, however, the term "MR coil" and similar phraseology as used herein is to be understood as encompassing other coil types and coil arrays known for use in exciting or receiving MR signals. For example, the MR transmit and receive coils 22, 32 could be a whole-body birdcage coil, a head coil or coil array, a limb coil or coil array, a surface coil array, or so forth. The MR coils 22, 32 may employ any suitable RF circuit technology, e.g. may employ strip line or micro-strip conductors, transmission line configurations, solid conductors, or so forth, with lumped and/or distributed capacitive and/or inductive tuning elements, and/or so forth. Furthermore, in some embodiments the same physical coil (that is, an MR transceiver coil or coil array) may serve as both the MR transmit and receive coils 22, 32 using suitable switching circuitry.

The MR transmit chain 20 is first considered. In a conventional design, the transmit chain employs digital circuitry to generate a digital RF pulse at baseband which is converted to the analog domain and modulated (i.e. frequency-shifted) using an analog or digital mixer or the like to the MR frequency band, amplified and applied to the MR transmit coil. In this conventional approach, the digital RF pulse has a large dynamic range (in terms of amplitude) and accordingly the components of the MR transmit chain must be of sufficiently high speed and high (analog) sensitivity or high (digital) resolution to process the RF pulse without clipping or undue distortion. The MR transmit chain 20 of FIG. 1 avoids this problem as follows.

With continuing reference to FIG. 1, the illustrative MR transmit chain 20 includes a digital signal generator 40 which generates a digital signal at baseband representing the desired RF excitation pulse. In illustrative FIG. 1, this digital signal is a digital chirp signal 42, in which the signal frequency is ramped up linearly over a time T from an initial frequency $f1_B$ to a final frequency $f2_B$ both within the baseband. In the illustrative example the chirp signal 42 is monotonically increasing with $f2_B > f1_B$; however, in a variant embodiment the chirp signal may be monotonically decreasing. The chirp signal 42 advantageously has a low dynamic range (in terms of amplitude) compared with a sharply peaked pulse signal, and the dynamic range can be adjusted by adjusting the time T and the start and end frequencies $f1_B$ and $f2_B$. The digital signal 42 generated by the digital signal generator 40 is modulated to the MR frequency band by operation of a digital RF modulator 44, and then converted to the analog domain by a digital-to-analog (D/A) converter 46. In an alternative embodiment, the D/A converter 46 may be applied first followed by an analog RF modulator. In either case, the result is an analog signal at the MR frequency band. An RF amplifier 48 is applied to amplify the analog signal at the MR frequency band to the desired signal power. However, this signal is still a chirp signal (in the illustrative embodiment, or more generally a signal with a lower dynamic range, in terms of amplitude, than a narrowly peaked signal of the type usually preferred for performing MR excitation).

As disclosed herein, the analog signal at the MR frequency band is suitably increased in dynamic range by an analog dispersive delay line 50 to generate the desired RF excitation signal with a narrow and large peak (and hence a larger dynamic range). To accomplish this, the analog dispersive delay line 50 imposes a frequency-dependent signal delay 52 that is monotonically increasing or (as in the illustrative example) or monotonically decreasing (in an alternative embodiment) over the MR frequency band. More particularly, the frequency-dependent signal delay 52 is chosen to cancel the linear signal frequency ramp of the chirp signal 42, so that all signal frequencies align in time, thereby producing a higher dynamic range RF excitation pulse with a large peak. As the illustrative chirp signal 42 is monotonically increasing in frequency from $f1_B$ to $f2_B$ over the time interval T, the frequency-dependent signal delay 52 monotonically decreases from a longest delay at a frequency $f1_{MR}$ (which is equal to the baseline frequency $f1_B$ modulated into the MR frequency band by the RF modulator 44) to a shortest (or optionally zero) delay at a frequency $f2_{MR}$ (which is equal to the baseline frequency $f2_B$ modulated into the MR frequency band by the RF modulator 44). The difference between the longest time delay for $f1_{MR}$ and the shortest (or zero) delay for $f2_{MR}$ is equal to the time interval T to provide maximum dynamic range adjustment of the chirp signal 42. (By analogy, if the generated chirp signal were monotonically decreasing then the frequency-dependent signal delay imposed by the analog dispersive delay line would appropriately be monotonically increasing). The resulting RF excitation pulse is applied to the MR transmit coil 22 which radiates the MR excitation pulse into the examination region 14.

The analog dispersive delay line 50 may be constructed using any known technology that can generate the desired frequency-dependent signal delay 52. For example, the analog dispersive delay line 50 may be a surface acoustical wave (SAW) device that leverages frequency-dependent acoustic delays, or may be a reflection mode delay line leveraging frequency-dependent reflection phase shifts.

With continuing reference to FIG. 1, the MR receive chain 30 is now considered. The MR receive coil 32 receives an MR signal which typically has a high dynamic range due to a large signal peak in the vicinity of the center of k-space and much lower signal strength in peripheral areas of k-space. Alternatively, viewed in the time domain the signal strength is highest at initial RF excitation of the MR signal and at any subsequent spin echo or gradient echo peaks, and is much lower at other points in the imaging sequence. The received MR signal is also typically weak, and accordingly a pre-amplifier 54 may be initially applied to boost the MR signal strength prior to the MR signal being digitized by an analog-to-digital (A/D) converter 56 and demodulated by a digital RF demodulator 58 that shifts the MR signal from the MR frequency band to baseband. In an alternative embodiment, the receive chain may include an analog RF demodulator followed by an A/D converter to digitize the MR signal after demodulation to baseband.

To more readily accommodate the typically high dynamic range of the MR signal received by the MR receive coil 32, an analog dispersive delay line 60 is inserted into the MR receive chain after the MR coil 32 (and, in the illustrative embodiment, after the pre-amplifier 54, and before the downstream A/D converter 56 and RF demodulator 58. The analog dispersive delay line 60 imposes a frequency-dependent signal delay 62 that is monotonically increasing or (as in the illustrative example) or monotonically decreasing (in an alternative embodiment) over the MR frequency band. The frequency-dependent signal delay 62 is chosen to spread the peaked MR signal so as to produce an MR signal that has lower dynamic range compared with the received (and optionally pre-amplified) MR signal. The illustrative frequency-dependent signal delay 62 is monotonically increasing from a shortest delay at a lower $f1_{MR}$ to a longest delay at a higher frequency $f2_{MR}$ (that is, $f2_{MR} > f1_{MR}$ where both $f1_{MR}$ and $f2_{MR}$ are in the MR frequency band), with the time difference between the longest delay at $f2_{MR}$ and the shorted delay at $f1_{MR}$ being denoted as time difference T.

As with the analog dispersive delay line 50 of the MR transmit chain 20, the analog dispersive delay line 60 of the MR receive chain 30 may be constructed using any known technology that can generate the desired frequency-dependent signal delay 62. For example, the analog dispersive delay line 60 may be a surface acoustical wave (SAW) device that leverages frequency-dependent acoustic delays, or may be a reflection mode delay line leveraging frequency-dependent reflection phase shifts.

The received MR signal after dispersion by the analog dispersive delay line 60 is processed by an image reconstruction processor 64 (for example, implemented on an illustrative server computer 66, desktop computer 67, or on some other computer or electronic digital processor) to generate a reconstructed MR image that is suitably displayed on a display 68 of a computer 67, stored in a Picture Archiving and Communication System (PACS, not shown), and/or otherwise utilized. The image reconstruction processor 64 can utilize any suitable image reconstruction algorithm appropriate for the spatial encoding employed by the MR imaging pulse sequence executed by the MR imaging device 10 to generate the MR signal, e.g. the image reconstruction processor 64 may employ a Fourier image reconstruction, an iterative reconstruction algorithm, or so forth. Likewise, if MR spectroscopy is perform suitable Fourier or other processing of the MR signal is performed to generate MR spectrum data (optionally spatially encoded, e.g. an MR spectroscopy image).

Besides the advantageous reduction in dynamic range, the impact of the frequency-dependent signal delay 62 imposed on the MR signal by the analog dispersive delay line 60 is to shift only the phase of the signal at the different frequencies, but not the amplitudes. That is, the analog dispersive delay line 60 operates as a phase-only linear dispersion filter. As a consequence, if the image reconstruction processor 64 operates to generate an amplitude image that does not rely upon the phase information contained in the MR signal, then the frequency-dependent signal delay 62 introduced by the analog dispersive delay line 60 has no impact on the reconstructed image. Likewise, for MR spectroscopy if only amplitude information is leveraged then the frequency-dependent signal delay 62 introduced by the analog dispersive delay line 60 has no impact on the extracted MR spectral information. In such cases, insertion of the analog dispersive delay line 60 into the analog signal processing sub-chain of the MR receive chain 30 has no practical impact beyond the advantageous dynamic range reduction, and no further modification on either the analog or digital signal processing sub-chains of the MR receive chain 30 is needed.

On the other hand, if the image reconstruction processor 64 leverages phase information contained in the MR signal, as is the case in some imaging techniques such as some diffusion weighted imaging (DWI) approaches, then the frequency-dependent signal delay 62 imposed by the analog dispersive delay line 60 could be problematic. In such cases, a digital dispersive delay line 70 is suitably inserted into the digital signal processing sub-chain, preferably downstream of any components such as the digital RF demodulator 58 that may benefit from the reduced dynamic range imparted by the analog dispersive delay line 60. The digital dispersive delay line 70 is tuned to impose a monotonically decreasing (as in the illustrative embodiment) or monotonically increasing (in an alternative embodiment) frequency-dependent signal delay 72 that is effective to cancel the frequency-dependent signal delay 62 imposed by the analog dispersive delay line 60. Thus, as the illustrative frequency-dependent signal delay 62 imposed by the analog dispersive delay line 60 is monotonically increasing in frequency from $f1_{MR}$ to $f2_{MR}$ with the difference in delays being T, the frequency-dependent signal delay 72 monotonically decreases from a longest delay at a frequency $f1_B$ (which is equal to the frequency $f1_{MR}$ in the MR frequency band demodulated to baseband by the RF demodulator 58) to a shortest (or optionally zero) delay at a frequency $f2_B$ (which is equal to the frequency $f2_{MR}$ in the MR frequency band demodulated to baseband by the RF demodulator 58). The difference between the longest time delay for $f1_B$ and the shortest (or zero) delay for $f2_B$ is equal to the same time different T as in the illustrative frequency-dependent signal delay 62 imposed by the analog dispersive delay line 60, thus providing cancellation of the delay 62. (By analogy, if the frequency-dependent signal delay imposed by the analog dispersive delay line were monotonically decreasing then the frequency-dependent signal delay imposed by the digital dispersive delay line would appropriately be monotonically increasing). As the frequency-dependent signal delay 72 imposed by the digital dispersive delay line 70 cancels the frequency-dependent signal delay 62 imposed by the analog dispersive delay line 60, the phase information is corrected and the image reconstruction processor 64 (or spectral analysis in the case of MR spectroscopy) can effectively utilize the corrected phase information.

The analog dispersive delay line 60 may, in general, be located with the MR receive coil 32, or with the receiver electronics. For example, in a digital MR receive coil design, the A/D converter 56 is disposed with the MR receive coil 32 and the pre-amplifier 54 on a single receive coil substrate 76. In such digital MR receive coil embodiments, the analog dispersive delay line 60 is also disposed on the single receive coil substrate 76 so as to be interposed along the MR receive chain between the MR receive coil 32 and the on-board A/D converter 56. Thus, in these embodiments the single receive coil substrate 76 commonly supports the MR receive coil 32, the analog dispersive delay line 60, and the A/D converter 56.

On the other hand, in analog MR receive coil embodiments in which the analog MR signal received by the MR coil 32 is ported off the receive coil substrate, the A/D converter 56 is then located with the receive electronics (e.g., in an electronic component housing containing the A/D converter 56 and also housing the RF demodulator 58). In this case, the analog dispersive delay line 60 may be located either on the same receive coil substrate that supports the MR receive coil, or may be located with the receive electronics upstream along the receive RF chain of the A/D converter.

In FIG. 1, the notation $f1_B$, $f2_B$, $f1_{MR}$, $f2_{MR}$, T used to denote the various parameters for the chirp signal 42 and the analog dispersive delay line 50 of the illustrative MR transmit chain 20, on the one hand, and the notation $f1_B$, $f2_B$, $f1_{MR}$, $f2_{MR}$, T used to denote the various parameters for the analog and digital dispersive delay lines 60, 70 of the illustrative MR receive chain 30, on the other hand, are the same. However, this is not necessarily the case, and it is contemplated for the parameters $f1_B$, $f2_B$, $f1_{MR}$, $f2_{MR}$, T in the transmit and receive RF chains to have different values.

FIG. 1 illustrates employing the analog dispersive delay line 50 in the MR transmit chain 20, on the one hand, and also employing the analog dispersive delay line 60 (and the optional digital dispersive delay line 70) in the MR receive chain 30. However, it will be appreciated that these are operationally independent.

For example, a given implementation may employ the analog dispersive delay line 50 in the MR transmit chain 20, but not employ the analog dispersive delay line 60 (and the optional digital dispersive delay line 70) in the MR receive chain 30.

Likewise, in another example, a given implementation may employ the analog dispersive delay line 60 (and the optional digital dispersive delay line 70) in the MR receive chain 30, but not employ the analog dispersive delay line 50 in the MR transmit chain 20.

Figure 2:
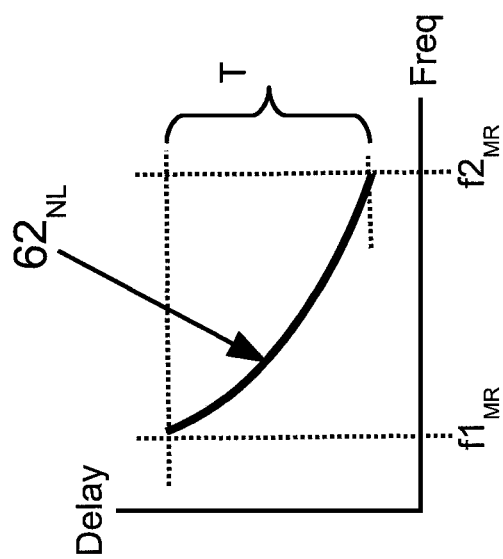
FIGS. 2 and 3 diagrammatically shows alternative monotonic frequency-dependent signal delays suitably implemented by in alternative embodiments of the dispersive delay line components of the MR receive chain of FIG. 1.
Figure 3:
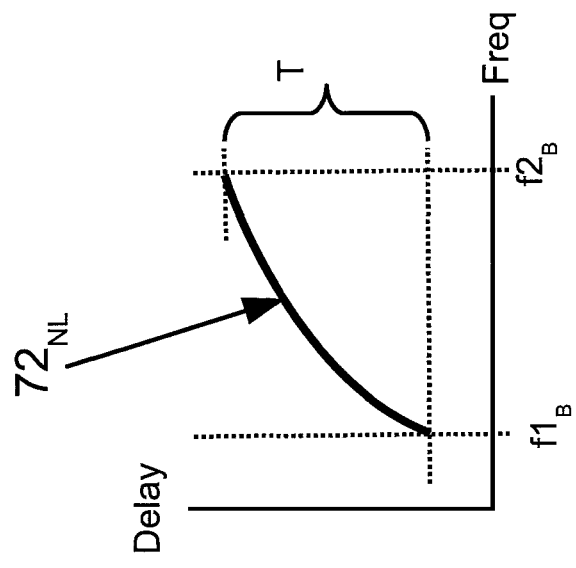

With reference to FIGS. 2 and 3, in other variants, it is contemplated to employ a dispersive delay line with a non-linear, but still monotonic, frequency-dependent signal delay. FIG. 2 illustrates an alternative frequency-dependent signal delay $62_{NL}$ that is monotonically decreasing and is also non-linear, i.e. the delay as a function of frequency is not a straight line. This is an alternative embodiment to the illustrative linear monotonically increasing frequency-dependent signal delay 62 shown in FIG. 1 for the analog dispersive delay line 60. If the delay-cancelling digital dispersive delay line 70 is also employed, FIG. 3 shows a suitable variant frequency-dependent signal delay $72_{NL}$ that is monotonically increasing and also nonlinear with a shape suitable to cancel the frequency-dependent delay introduced by the frequency-dependent signal delay $62_{NL}$ of FIG. 2. Although not illustrated, in an analogous variant for the RF transmit chain 20, the digital signal generator 40 is contemplated to generate a digital signal at baseband with the shape shown in FIG. 2 (but at baseband), in which case the analog dispersive delay line 50 suitably imposes the frequency-dependent signal delay shown in FIG. 3 (but at the MR frequency band) so as to increase the dynamic range of the signal to produce a sharply peaked RF pulse.

In general, the digital components of the digital signal processing (sub-)chain 40, 44 of the transmit chain 20 and of the digital signal processing (sub-)chain 58, 70 of the receive chain 30 may comprises any type of hardwired or programmable digital component. As non-limiting illustrative examples, these digital components may comprise one or more of a microprocessor, a microcontroller, a field-programmable gate array (FPGA), a digital application-specific integrated circuit (ASIC), one or more discrete logic gate components, various combinations thereof, and/or so forth. The analog components of the analog signal processing (sub-)chain 48, 50 of the transmit chain 20 and of the analog signal processing (sub-)chain 54, 60 of the receive chain 30 may comprises any type of analog discrete component or integrated circuit (IC) or various combinations thereof, e.g. mixer IC chips may be used in implementing analog RF modulator or demodulator components, and as previously mentioned the analog dispersive delay lines may be implemented as SAW devices and/or reflection mode delay lines or so forth. The A/D and D/A converters may likewise be implemented as discrete and/or IC components, optionally employing a bank of A/D or D/A converters to handle the total number of bits (e.g. a bank of four eight-bit converters can provide 32-bit conversion).

In general, the dispersive delay lines 50, 60, 70 used to adjust signal dynamic range to control peak amplitudes in the transmitted excitation RF signal or the received MR signal should be approximately matched to the frequency range of the MR acquisition. The smaller the bandwidth (or, more precisely, the smaller the value of T), the less dynamic range adjustment the filter will produce. It is contemplated to use multiple dispersive delay lines with appropriate switch-in/switch-out circuitry if communication from the system can inform the local circuits of the preferred state. The end result of effective use of this approach is a much lower dynamic range and a more predictable level for MR signal sampling.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A radio frequency (RF) device for receiving or exciting a magnetic resonance (MR) signal in an MR imaging or spectroscopy subject, the RF device comprising:
   an MR coil tuned to an MR frequency band;
   a digital signal processing chain at least partly tuned to operate at baseband;
   an analog signal processing chain operatively connected with the MR coil and at least partly tuned to operate at the MR frequency band and including an analog dispersive delay line tuned to impose a frequency-dependent signal delay that is monotonically increasing or monotonically decreasing over the MR frequency band; and an analog-to-digital (A/D) or digital-to-analog (D/A) converter connecting the digital signal processing chain and the analog signal processing chain.

2. The RF device of claim 1 for receiving an MR signal, wherein:

the MR coil comprises an MR receive coil tuned to receive an MR signal in the MR frequency band;

the analog dispersive delay line is connected to convert the MR signal received by the MR receive coil to a dispersed MR signal; and the A/D or D/A converter comprises an A/D converter connected to digitize the dispersed MR signal.

3. The RF device of claim 2 wherein the digital signal processing chain includes a digital dispersive delay line tuned to impose a monotonically increasing or monotonically decreasing frequency-dependent signal delay effective to cancel the frequency-dependent signal delay imposed by the analog dispersive delay line.

4. The RF device of claim 2 wherein the analog signal processing chain further includes a pre-amplifier interposed between the MR receive coil and the analog dispersive delay line to amplify the MR signal received by the MR receive coil.

5. The RF device of claim 2 wherein the digital signal processing chain includes a digital RF demodulator operative to demodulate the digitized dispersed MR signal to baseband.

6. The RF device of claim 1 for exciting an MR signal, wherein:

the MR coil comprises an MR transmit coil tuned to transmit an RF excitation pulse in the MR frequency band;

the digital signal processing chain is configured to generate a digital signal in the MR frequency band;

the A/D or D/A converter comprises a D/A converter configured to convert the digital signal to an analog signal; and the analog dispersive delay line is connected to increase dynamic range of the analog signal to generate the RF excitation pulse.

7. The RF device of claim 6 wherein the digital signal processing chain includes a signal generator configured to generate the digital signal at baseband and an RF modulator configured to modulate the digital signal at baseband to generate the digital signal in the MR frequency band.

8. The RF device of claim 6 wherein the analog signal processing chain further includes an RF amplifier interposed between the D/A converter and the analog dispersive delay line to amplify the analog signal prior to the increase in dynamic range by the analog dispersive delay line.

9. The RF device of claim 6 wherein:

the digital signal processing chain is configured to generate the digital signal in the MR frequency band as a digital chirp signal;

the D/A converter is configured to convert the digital chirp signal to an analog chirp signal; and and the analog dispersive delay line is connected to increase the dynamic range of the analog chirp signal to generate the RF excitation pulse.

10. The RF device of claim 1 wherein the digital signal processing chain comprises one or more of a microprocessor, a microcontroller, a field-programmable gate array (FPGA), a digital application-specific integrated circuit (ASIC), and one or more discrete logic gate components.

11. A radio frequency (RF) device comprising a magnetic resonance (MR) receive coil configured to receive an MR signal in an MR frequency band;

an analog dispersive delay line connected to disperse the MR signal received by the MR receive coil to generate a dispersed MR signal; and an analog-to-digital (A/D) converter connected to generate a digitized dispersed MR signal from the dispersed MR signal.

12. The RF device of claim 11 further comprising:

a pre-amplifier interposed between the MR receive coil and the analog dispersive delay line amplify the MR signal received by the MR receive coil prior to dispersion by the analog dispersive delay line.

13. The RF device of claim 11 further comprising:

a single receive coil substrate commonly supporting the MR receive coil, the analog dispersive delay line (60), and the A/D converter.

14. The RF device of claim 11 further comprising:

a digital RF demodulator configured to demodulate the digitized dispersed MR signal from the MR frequency band to baseband.

15. The RF device of claim 11 further comprising:

an RF demodulator configured to demodulate one of the dispersed MR signal and the digitized dispersed MR signal from the MR frequency band to baseband; and a digital dispersive delay line configured to cancel the dispersion of the digitized dispersed MR signal introduced by the analog dispersive delay line after demodulation by the RF demodulator to baseband.

16. A radio frequency (RF) device comprising a digital signal processing chain configured to generate a digital signal in an MR frequency band;

a digital-to-analog (D/A) converter configured to convert the digital signal to an analog signal; and an analog dispersive delay line connected to increase dynamic range of the analog signal to generate an RF excitation pulse.

17. The RF device of claim 16 wherein the digital signal processing chain includes:

a signal generator configured to generate a digital signal at baseband; and a digital RF modulator configured to modulate the digital signal at baseband to generate the digital signal in the MR frequency band.

18. The RF device of claim 16 further comprising:

an RF amplifier interposed between the D/A converter and the analog dispersive delay line to amplify the analog signal prior to the increase in dynamic range by the analog dispersive delay line.

19. The RF device of claim 16 wherein:

the digital signal processing chain is configured to generate the digital signal in the MR frequency band as a digital chirp signal;

the D/A converter is configured to convert the digital chirp signal to an analog chirp signal; and and the analog dispersive delay line is connected to increase the dynamic range of the analog chirp signal to generate the RF excitation pulse.

20. The RF device of claim 16 further comprising:

an MR transmit coil tuned to transmit an MR excitation signal in response to receiving the RF excitation pulse generated by the analog dispersive delay line.

* * * * *